United States Patent [19]
Kim et al.

[11] Patent Number: 6,046,064
[45] Date of Patent: Apr. 4, 2000

[54] METHOD FOR FABRICATING CHEMICAL SEMICONDUCTOR DEVICE

[75] Inventors: Chang-Tae Kim; Ki-Woong Chung, both of Seoul, Rep. of Korea

[73] Assignee: LG Electronics Inc., Seoul, Rep. of Korea

[21] Appl. No.: 08/841,723

[22] Filed: Apr. 24, 1997

[30] Foreign Application Priority Data

May 2, 1996 [KR]  Rep. of Korea ..................... 96/14272

[51] Int. Cl.⁷ ................................................. H01L 21/00
[52] U.S. Cl. ................................ 438/39; 438/46; 438/167
[58] Field of Search ................................. 438/39, 46, 93, 438/164, 602–606, 47, 94, 167

[56] References Cited

U.S. PATENT DOCUMENTS

| 5,411,914 | 5/1995 | Chen et al. ............................. 437/107 |
| 5,668,049 | 9/1997 | Chakrabarti et al. ...................... 438/33 |
| 5,807,765 | 9/1998 | Razeghi et al. ........................... 438/38 |

*Primary Examiner*—Joni Chang
*Attorney, Agent, or Firm*—John P. White; Cooper & Dunham LLP

[57] ABSTRACT

Method for fabricating a compound semiconductor device including the steps of forming an active layer on a substrate, forming a plurality of ohmic electrodes on predetermined regions of the active layer, forming a mask material layer on the entire surface of the active layer inclusive of the ohmic electrodes, removing the mask material layer from predetermined regions thereof to open regions of the active layer between the ohmic electrodes and at least any one of the ohmic electrodes, etching the opened regions of the active layer each to a predetermined depth, and removing the mask material layer and forming a gate electrode on each of the opened regions of the active layer each having been etched to the predetermined depth, whereby the possibility of forming devices having threshold voltages different from one another on the same substrate allows application of the device of the present invention to variety of MMIC.

16 Claims, 8 Drawing Sheets

METHOD FOR FABRICATING CHEMICAL SEMICONDUCTOR DEVICE

BACKGROUND OF THE INVENTION

1. Field of the Invention

The present invention relates to semiconductor device, and more particularly, to a method for fabricating a compound semiconductor device.

2. Discussion of the Related Art

In general, a recess etching technique is widely applied to the fabrication of a GaAs FET, one of the compound semiconductor devices. The recess etching is applied to the etching of an active layer to form a gate electrode on the active layer in formation of a gate pattern of the compound semiconductor device. A thickness of the active layer is dependent on a ratio of etching of the recess, which thick, iss is closely related to a threshold voltage of the compound semiconductor device. The relation between the thickness of the active layer and the threshold voltage can be expressed with an equation shown below.

$$D = \sqrt{\frac{2\varepsilon(Vbi - Vth)}{qNd}}$$

Where, D is the active layer thickness, Nd is a doping concentration of the active layer, Vbi is a built-in voltage of a Shottky contact, $\varepsilon$ is a dielectric constant of GaAs, and Vth is the threshold voltage. It can be known from the equation that the thicker the active layer, the higher the threshold voltage, and the thinner the active layer, the lower the threshold voltage.

A conventional method for fabricating a compound semiconductor device applying such a recess etching technique thereto will be explained with reference to the attached drawings.

FIGS. 1a~1e illustrate sections showing steps of a conventional method for fabricating an MESFET(Metal Semiconductor Field Effect Transistor).

Referring to FIG. 1a, an undoped GaAs buffer layer 2, an n-GaAs active layer 3 and an n$^+$-GaAs cap layer 4 are formed on a semi-insulating GaAs substrate 1 in succession, and a predetermined portion of each of the cap layer 4, the active layer 3 and the buffer layer 2 are subjected to mesa etching for isolation between devices. Referring to FIG. 1b, the source and drain electrodes 5 and 6 are formed in predetermined regions on the cap layer 4, and, as shown in FIG. 1c, a photoresist 7 is formed on the entire surface of the substrate 1 including the source and drain electrodes 5 and 6 and subjected to patterning to open a portion of the cap layer 4 between the source and drain electrodes 5 and 6. The opened cap layer 4 and the underlying active layer 3 are wet etched to a predetermined depth to form a recess. Referring to FIG. 1d, a gate metal 8 is formed on the entire surface of the opened active layer 3 and the photoresist 7, and, as shown in FIG. 1e, the photoresist 7 and the overlying gate metal 8 are lifted-off to form a gate electrode 8a on the active layer 3, thereby an MESFET device is fabricated.

However, the aforementioned conventional method for fabricating a compound semiconductor device has the following problem.

The individual formation of devices each having threshold voltages different from one another in providing a circuit requiring a variety of threshold voltages causes the fabrication cost high.

SUMMARY OF THE INVENTION

Accordingly, the present invention is directed to a method for fabricating a compound semiconductor device that substantially obviates one or more of the problems due to limitations and disadvantages of the related art.

An object of the present invention is to provide a method for fabricating a compound semiconductor device on the same substrate, which device has threshold voltages different from one another.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a compound semiconductor device includes the steps of forming an active layer on a substrate, forming a couple of ohmic electrodes on predetermined regions of the active layer, forming a mask material layer on the entire surface of the active layer including the ohmic electrodes, removing the mask material layer from predetermined regions thereof to open regions of the active layer between the ohmic electrodes and at least any one of the ohmic electrodes, etching the opened regions of the active layer each to a predetermined depth, and removing the mask material layer and forming a gate electrode on each of the opened regions of the active layer each having been etched to the predetermined depth.

An etching ratio of the active layer is adjusted by adjusting a total area of the opened regions of the ohmic electrodes.

A threshold voltage of the device is adjusted by adjusting a total area of the opened regions of the ohmic electrodes and the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. FIGS. 2a~2e illustrate sections showing steps of a method for fabricating an MESFET in accordance with a first preferred embodiment of the present invention.

Figure 1A:
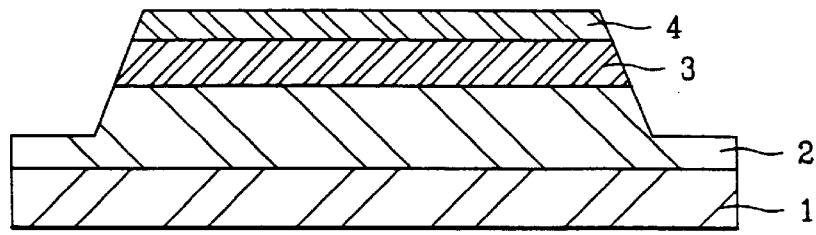
FIGS. 1a~1e illustrate sections showing steps of a conventional method for fabricating an MESFET.
Figure 1B:
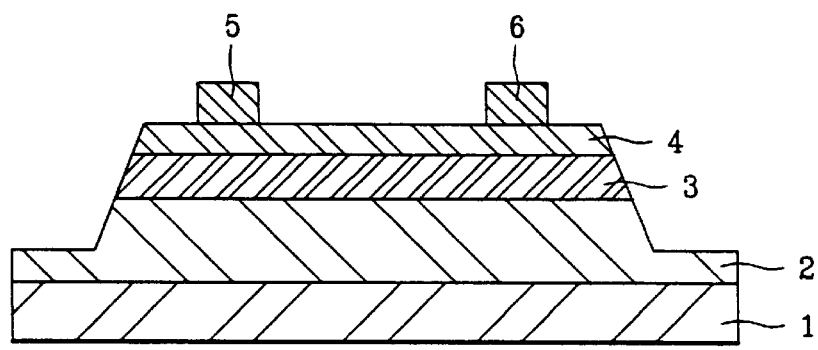
Figure 1C:
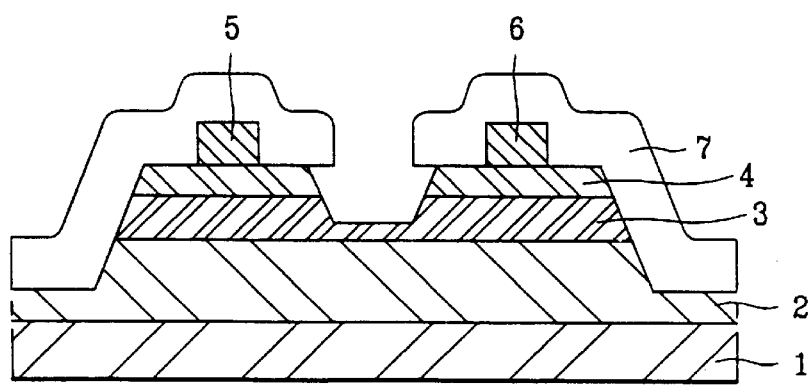
Figure 1D:
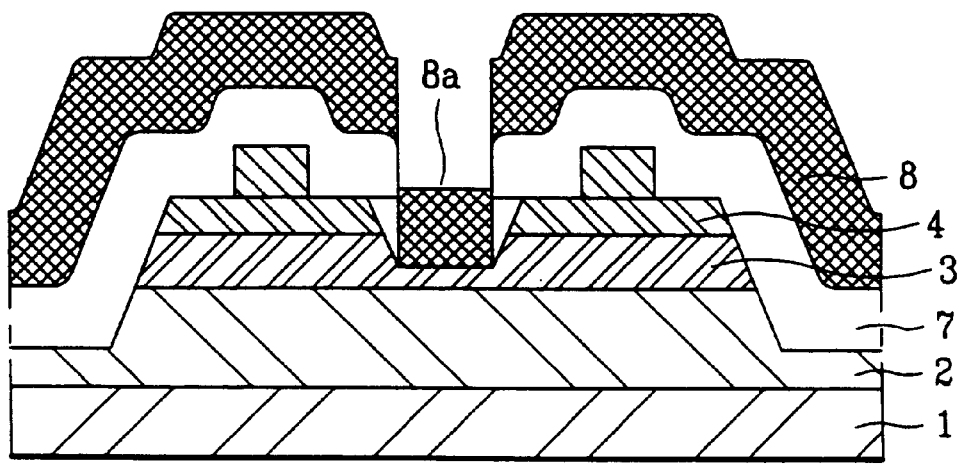
Figure 1E:
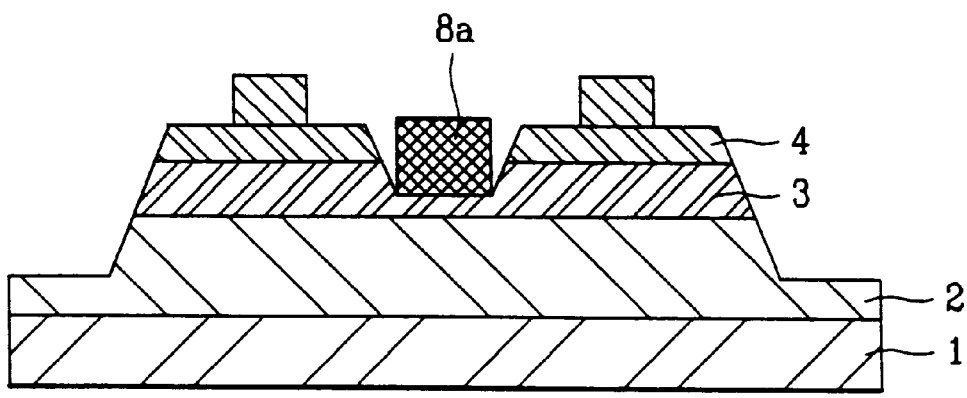
Figure 2A:
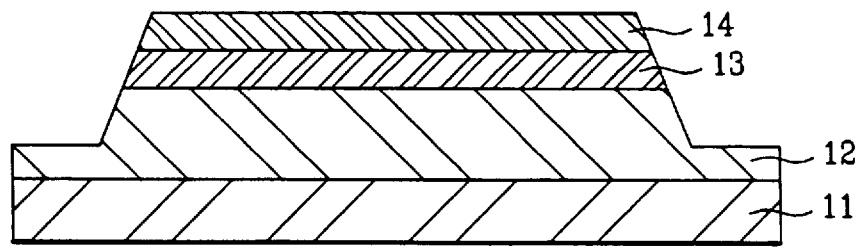
FIGS. 2a~2e illustrate sections showing steps of a method for fabricating an MESFET in accordance with a first preferred embodiment of the present invention.
Figure 2B:
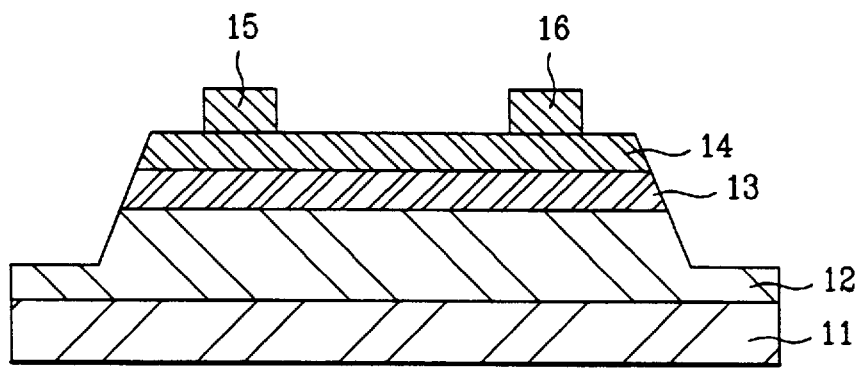
Figure 2C:
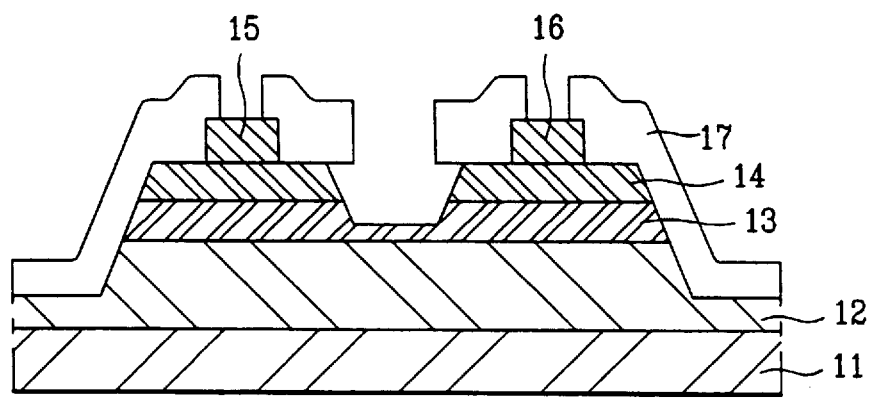
Figure 2D:
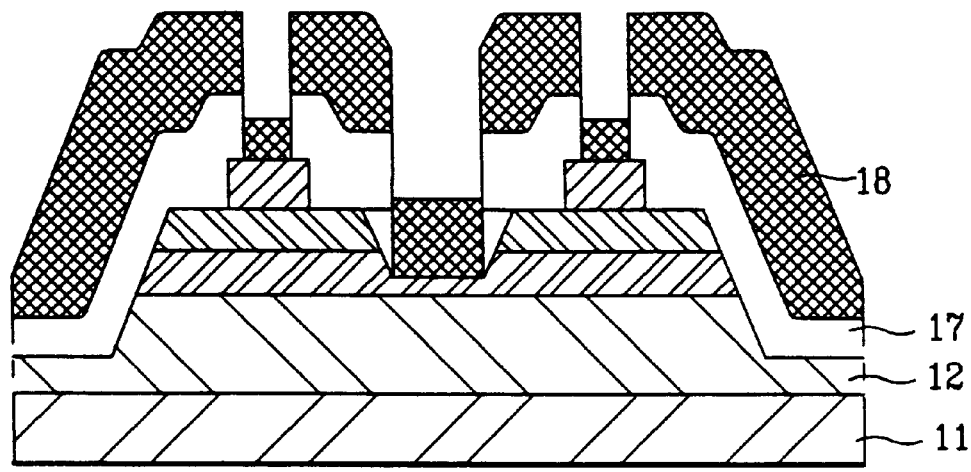
Figure 2E:
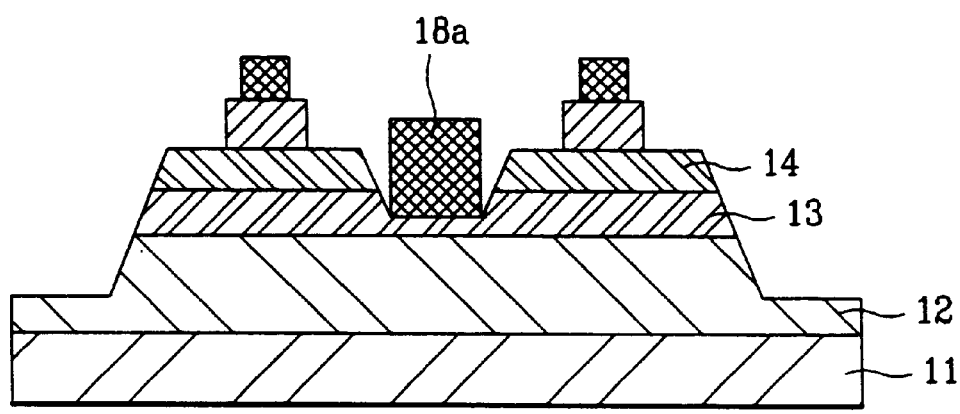

Referring to FIG. 2a, an undoped GaAs buffer layer 12, an n-GaAs active layer 13 and an n$^+$-GaAs cap layer 14 are formed on a semi-insulating GaAs substrate 11 in succession, and a predetermined portion of each of the cap layer 14, the active layer 13 and the buffer layer 12 are subjected to mesa etching for isolation between cells. Referring to FIG. 2b, source and drain electrodes 15 and 16 are formed in predetermined regions on the cap layer 14, and, as shown in FIG. 2c, a photoresist 17 is formed on the entire surface of the substrate 11 including the source and drain electrodes 15 and 16, and subjected to patterning to open a portion, which is a region a gate electrode to be formed thereon, of the cap layer 14 between the source and drain electrodes 15 and 16 as well as either one or all of the source electrode 15 and the drain electrode 16. The opened cap layer 14 and the underlying active layer 13 are exposed to the etchant, and active layer 13 is wet etched to a predetermined depth to form a recess. In this instance, an etching ratio of the active layer 13 can be adjusted according to sizes of the opened region areas of the source and drain electrodes 15 and 16. That is, the greater the areas of the opened regions of the source and drain electrodes 15 and 16, the greater the etching rate of the active layer 13 is, with a reduction of the thickness of the active layer 13. As the thickness of the active layer 13 is closely related to the threshold voltage of the device, the threshold voltage of the device can be adjusted by adjusting the areas of the opened regions of the source and drain electrodes 15 and 16. A plurality of the opened region areas can even be formed in each of the source and drain electrodes 15 and 16, partly. The principle that a threshold voltage of a device can be adjusted by adjusting areas of opened regions of source and drain electrodes 15 and 16 will be explained, later. Referring to FIG. 2d, a gate metal 18 is formed on the entire surface of the substrate 11 inclusive of the photoresist 17, and, as shown in FIG. 2e, the photoresist 17 and the overlying gate metal 18 are lifted-off to form a gate electrode 18a on the active layer 13, thereby an MESFET device is fabricated.

FIGS. 3a~3e illustrate sections showing steps of a method for fabricating an MESFET in accordance with a second preferred embodiment of the present invention.

Figure 3A:
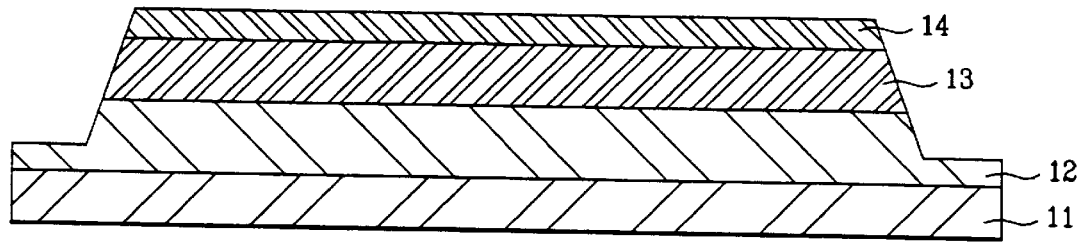
FIGS. 3a~3e illustrate sections showing steps of a method for fabricating an MESFET in accordance with a second preferred embodiment of the present invention.
Figure 3B:
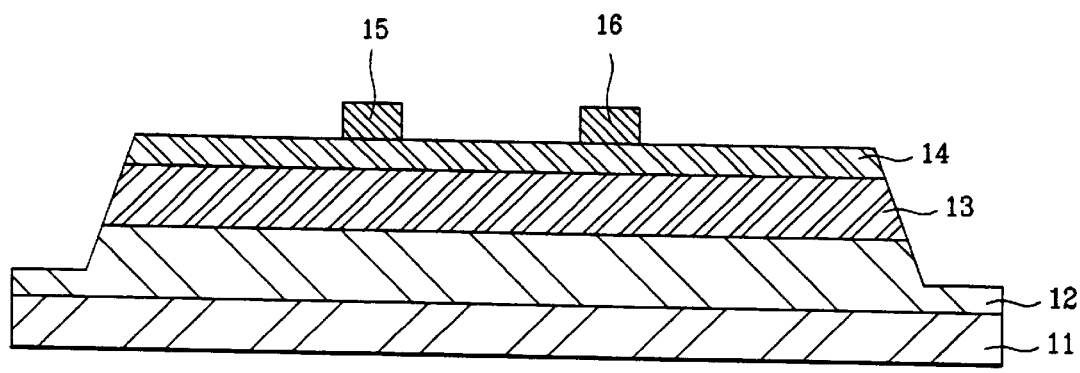

The explanations on FIGS. 3a and 3b will be omitted since they are the same with FIGS. 2a and 2b of the first embodiment, respectively.

Figure 3C:
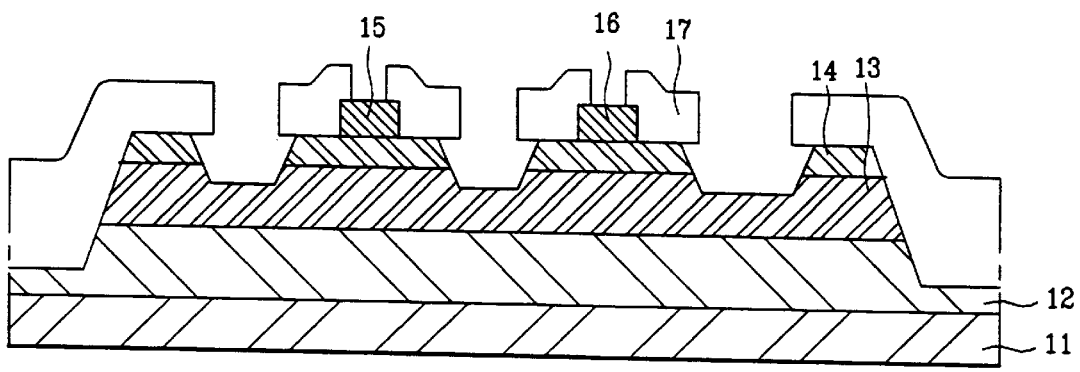
Figure 3D:
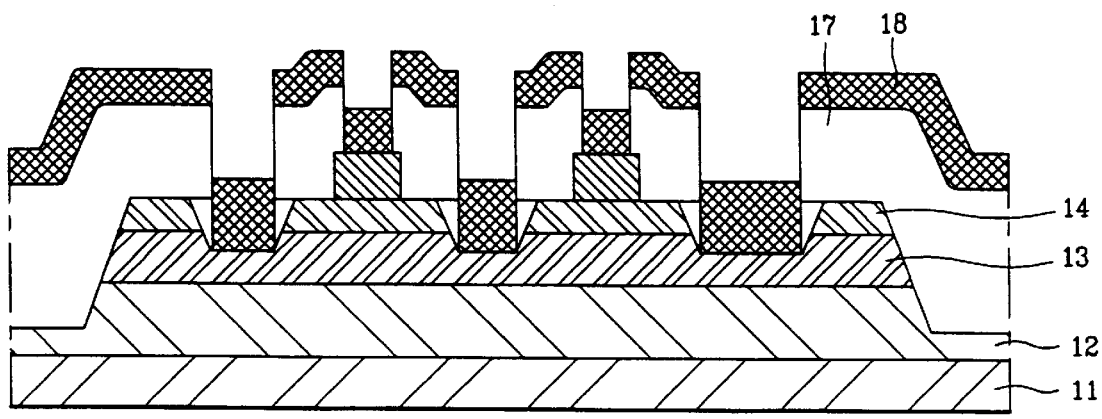
Figure 3E:
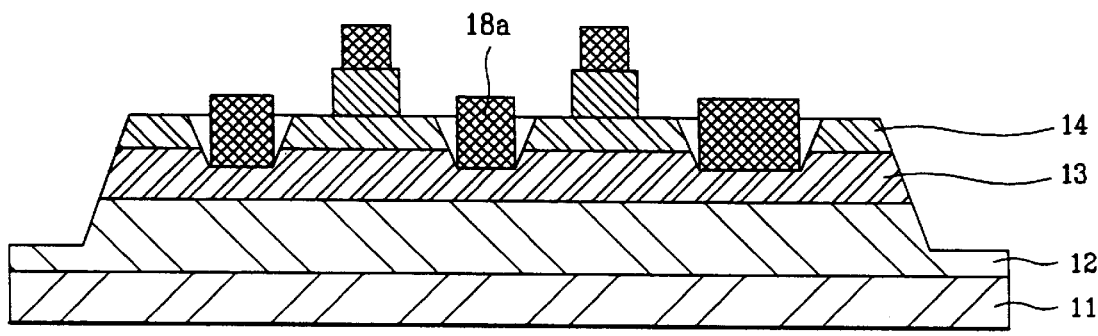

Referring to FIG. 3c, in continuation from the step shown in FIG. 3b, a photoresist 17 is formed on the entire surface of the substrate 11 inclusive of the source and drain electrodes 15 and 16, and subjected to patterning, to open a portion of the cap layer 14 between the source and drain electrodes 15 and 16, which is a region a gate electrode to be formed thereon, either one or all of the portions of the cap layer 14 on both sides of the source and drain electrodes 15 and 16, and either one or all of the source and drain electrodes 15 and 16. The opened portions of the cap layer 14 and the underlying active layer 13 are wet etched to form recesses. The opened portions of the cap layer 14 in mesa region on both sides of the source and drain electrodes 15 and 16 can adjust an etching ratio of the active layer 13 depending on sizes of the areas of the opened cap layer 14. That is, the greater the opened areas of the cap layer 14 in the mesa region on both sides of the source and drain electrodes 15 and 16, the smaller the etching rate of the active layer 13 on which a gate electrode is to be formed. Accordingly, by adjusting the areas of opened portions of the cap layer 14 in the mesa region, threshold voltage of the MESFET device can be adjusted. The principle that a threshold voltage of a device can be adjusted by adjusting areas of opened regions of source and drain electrodes 15 and 16 will be explained, later. Then, as shown in FIG. 3d, a gate metal 18 is formed on the entire surface of the substrate 11 inclusive of the photoresist 17, and, as shown in FIG. 3e, the photoresist 17 and the overlying gate metal 18 are lifted off to form a gate electrode 18a on the active layer 13, thereby an MESFET device having a plurality of threshold voltages on the same substrate can be fabricated. Thus, it can be known that the threshold voltage can be adjusted in two ways through the method of the present invention; The first one is a method in which sizes of photoresist windows formed on ohmic contact metals(source and drain electrodes) are varied, and the second one is a method in which sizes of dummy gate opened regions on the n$^+$ mesa layers(cap layer) adjacent to the ohmic contact metals are varied.

The principle of adjusting a threshold voltage of a device according to the two methods will be explained.

Figure 4A:
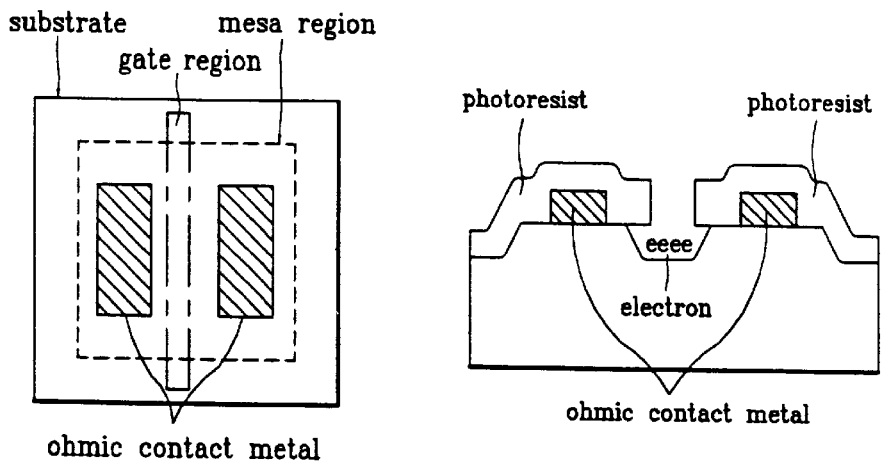
FIGS. 4a~4c each illustrates plane and sectional views for explaining a change in a recess etching ratio of a gate region according to positions of open regions in a device.
Figure 4B:
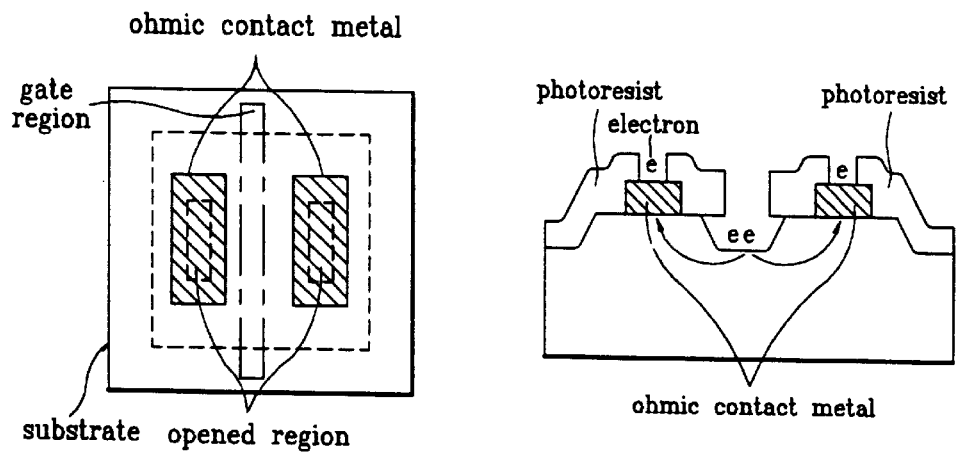
Figure 4C:
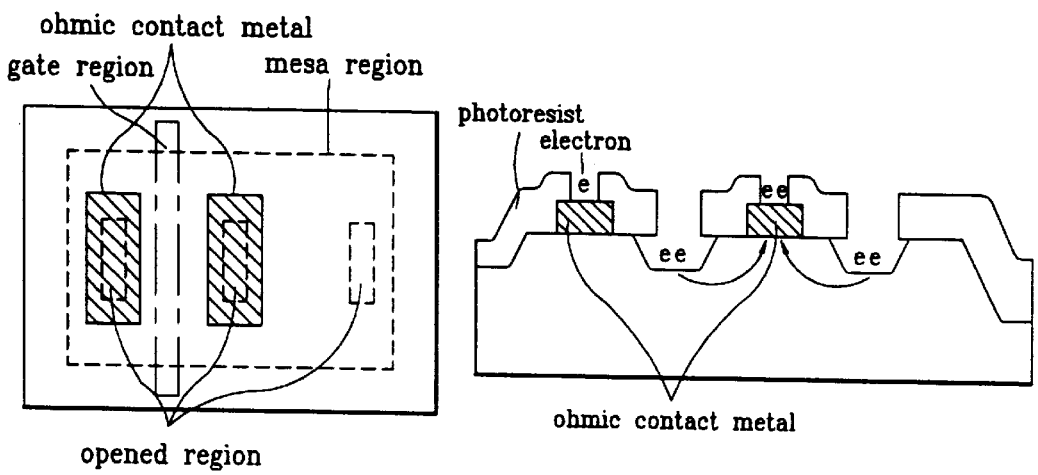

FIGS. 4a~4c each illustrates plane and sectional views for explaining change in a recess etching ratio of a gate region according to positions of opened regions in a device; wherein FIG. 4a illustrates a conventional method used in fabrication of an MESFET, including the steps of forming a photoresist without any opened region on ohmic contact metals and performing recess etching of a gate region, FIG. 4b illustrates a method used in fabrication of an MESFET, including the steps of forming a photoresist with an opened region on ohmic contact metals and performing recess etching of a gate region and FIG. 4c illustrates a method used in fabrication of an MESFET, including the steps of forming a photoresist to have dummy opened regions on ohmic contact metals and on a mesa layer adjacent to the ohmic contact metal and performing recess etching of a gate region.

A device shown in FIG. 4a and a device shown in FIG. 4b are exposed to the same etchant under the same conditions, and recess etching rate on the gate regions of each device are compared to find the recess etching rate of the device shown in FIG. 4b is greater than the recess etching rate of the device shown in FIG. 4a.

The reason is as follows.

When an etchant encounters with an opened portion of a semiconductor substrate, an etching proceeds with oxidation and reduction. As the oxidation is caused by production of electrons, the oxidation will either increase or decrease depending on supply of the electrons. In the device shown in FIG. 4a, as the oxidation of the device shown in FIG. 4b proceeds not by the etchant and the opened region on the ohmic metal contact, but by the etchant and the substrate in the gate region, an electrochemical potential is formed between the substrate in the gate region and the surface of the ohmic contact metal. Because of a potential gradient such a potential the electrons produce d in the surface of the substrate in the gate region immigrate to a surface of the ohmic contact metal through a channel layer in the substrate. In other words, the electrons supplied from the surface of the substrate in the gate region are consumed by reduction or anodic reaction in the surface of the ohmic contact metal. The lack of electrons in the substrate in the gate region as much as the immigrated electrons to the ohmic contact metals causes a rate of oxidation to increase. As a result, the recess etching rate in the gate region of the device shown in FIG. 4b is greater than the device shown in FIG. 4a. If the size of the opened region of the ohmic contact metal increases, the reduction on the ohmic contact metal will increase, with more consumption of the electrons, which accelerates oxidation and the etching.

Figure 5A:
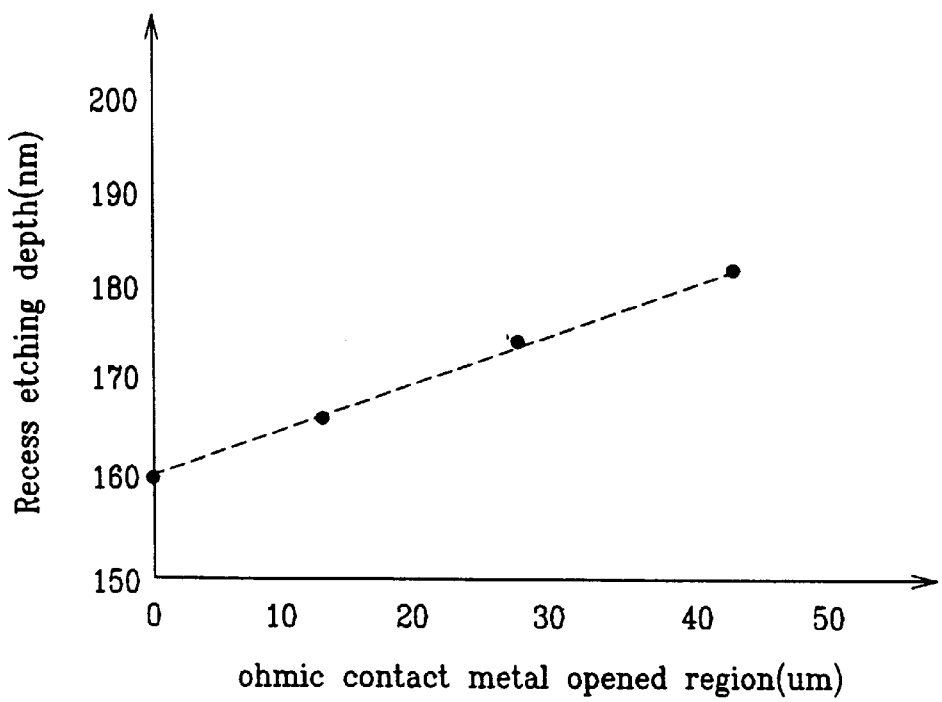
FIG. 5a illustrates a graph showing a relation between an open region area of an ohmic contact metal and a recess etching depth; and, FIG. 5b illustrates a graph showing a relation between an open region area of a dummy gate on a mesa layer and a thickness of an active layer.

FIG. 5a illustrates a graph showing a relation between an open region area of an ohmic contact metal and a recess etching depth wherein it can be known that the recess etching depth of the substrate in the gate region increases as the area of the opened region of the ohmic contact metal increases. By adjusting such a recess etching depth, threshold voltage of a device can be adjusted. Namely, when the area of the ohmic contact metal is increased from 0 to 1800 $\mu m^2$, a threshold voltage of a device can be increased from $-1.95$ V to $-0.90$ V. As shown in FIG. 4c, such a change of the recess etching rate is also influenced by the dummy opened region on the mesa layer adjacent to the ohmic contact metal. That is, as the etchant oxidizes a surface of the dummy gate opened region in the mesa layer, electrochemically induced electrons are produced, which electrons, alike the electrons produced from the gate region, immigrate to the ohmic contact metal through the channel layer. This additional supply of electrons causes to decrease the electrons supplied from the gate region to the ohmic contact metal. Therefore, the decreased consumption of the electrons in the gate region according to the increase of the dummy gate opened region in the mesa layer leads to a drop of the recess etching rate on the gate region.

Figure 5B:
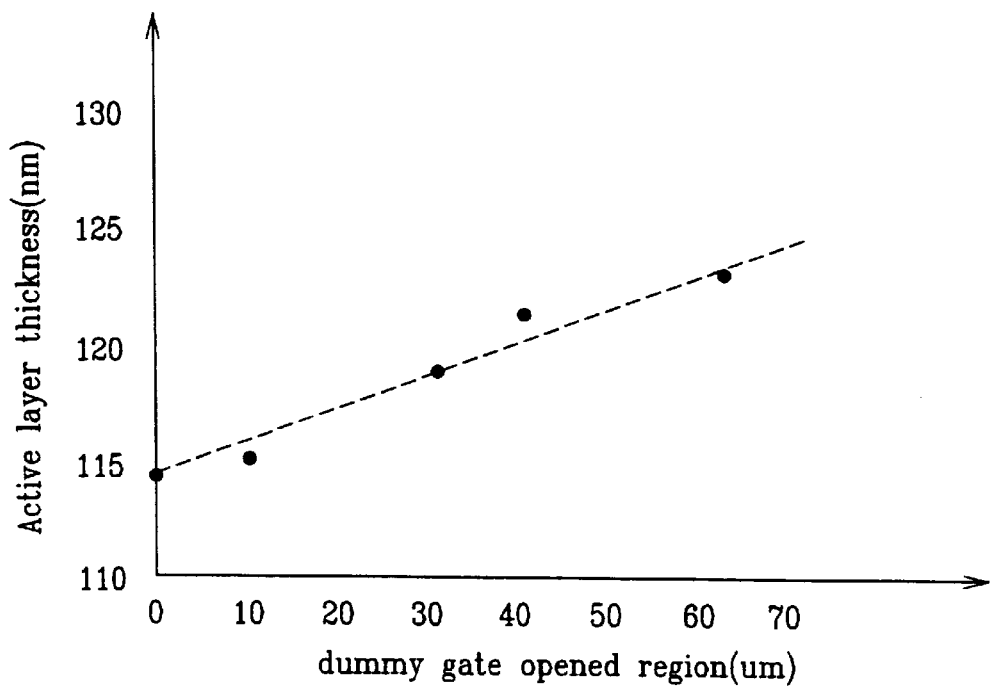

FIG. 5b illustrates a graph showing a relation between an open region area of a dummy gate on a mesa layer and a thickness of an active layer, wherein it can be known that a thickness of the active layer on the gate region increases as the area of the dummy opened region increases. By increasing the area of the dummy opened region from 0 to 4410 $\mu m^2$ by the aforementioned method, the threshold voltage of the device can be decreased from $-1.05$ V to $-1.40$ V.

The method for fabricating a chemical semiconductor device of the present invention has the following advantage.

The possibility of forming devices having threshold voltages different from one another on the same substrate allows application of the device of the present invention to variety of MMIC (Monolithic Microwave Integrate Circuit).

It will be apparent to those skilled in the art that various modifications and variations can be made in the method for fabricating a compound semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a compound semiconductor device comprising the steps of:

forming an active layer on a substrate;

forming a plurality of ohmic electrodes on regions of the active layer;

forming a mask material layer on the entire surface of the active layer inclusive of the ohmic electrodes;

removing the mask material layer from regions thereof to open regions of the active layer between the ohmic electrodes and at least any one of the ohmic electrodes;

etching the opened regions of the active layer each to a depth; and, removing the mask material layer and forming a gate electrode on each of the opened regions of the active layer each having been etched to the depth.

2. A method as claimed in claim 1, wherein an etching rate of one of the opened regions of the active layer is adjusted depending on a total area of the opened regions of the ohmic electrodes adjacent to the one of the opened regions of the active layer.

3. A method as claimed in claim 1, wherein a threshold voltage of the device is adjusted depending on a total area of the opened regions of the ohmic electrodes.

4. A method for fabricating a compound semiconductor device comprising the steps of:

forming a buffer layer, an active layer and a cap layer on a substrate in succession and subjecting a region of each of the cap layer, the active layer and the buffer layer to mesa etching for isolation of the device;

forming a plurality of ohmic electrodes on regions of the cap layer;

forming a mask material layer on the entire surface of the cap layer inclusive of the plurality of the ohmic electrodes;

removing the mask material layer from regions thereof to open at least one region of the cap layer of the cap layer on both sides of each of the ohmic electrodes and at least any one of the ohmic electrodes;

performing a recess etching of the opened regions of the cap layer and the active layer under the opened regions of the cap layer each to a depth; and, removing the mask material layer and forming a gate electrode on each of the regions of the active layer each having been recess etched to the depth.

5. A method as claimed in claim 4, wherein an etching rate of one of the opened regions of the active layer is adjusted depending on a total area of the opened regions of the ohmic electrodes adjacent to the one of the opened regions of the active layer.

6. A method as claimed in claim 4, wherein a threshold voltage of the device is adjusted depending on a total area of the opened regions of the ohmic electrodes.

7. A method as claimed in claim 4, wherein a threshold voltage of the device is adjusted depending on a total area of the opened regions of the cap layer.

8. A method for fabricating a compound semiconductor device comprising the steps of:

forming a buffer layer, an active layer and a cap layer on a substrate in succession and subjecting a region of each of the cap layer, the active layer and the buffer layer to mesa etching for isolation of the device;

forming a source electrode and drain electrode on regions of the cap layer;

forming a mask material layer on the entire surface of the cap layer inclusive of the source electrode and the drain electrodes;

removing the mask material layer from regions thereof to open a region of the cap layer between the source electrode and the drain electrode, at least any one region of the cap layer of the regions of the cap layer on both sides of a pair of the source electrode and the drain electrode, and at least any one of the source electrode and the drain electrode;

performing a recess etching of the opened regions of the cap layer and the active layer under the opened regions of the cap layer each to a predetermined depth;

forming a gate electrode material layer on the entire surface of the substrate inclusive of the mask material layer; and, removing the mask material layer and the gate electrode material layer to form a gate electrode on a region of the active layer between the source electrode and the drain electrode having been recess etched to the depth.

9. A method as claimed in claim 8, wherein an etching rate of one of the opened regions of the active layer is adjusted depending on a total area of the opened regions of the source electrode and the drain electrode adjacent to the one of the opened regions of the active layer.

10. A method as claimed in claim 8, wherein a threshold voltage of the device is adjusted depending on a total area of the opened regions of the source electrode and drain electrode.

11. A method as claimed in claim 8, wherein a threshold voltage of the device is adjusted depending on a total area of the opened regions of the cap layer.

12. A method as claimed in claim 8, wherein at least one region is opened when at least any one of the source electrode and the drain electrode is opened.

13. A method as claimed in claim 8, wherein the mask material layer is removed by lift-off process.

14. A method as claimed in claim 8, wherein the predetermined depth is different from one opened region to another opened region of the active layer.

15. A method as claimed in claim 8, wherein the recess etching is an wet etching.

16. The method as claimed in claim 8, wherein the mask material layer and the gate electrode material layer are formed of a material that makes no reaction with an etchant.

* * * * *